United States Patent
Mathis

(10) Patent No.: US 10,491,269 B2
(45) Date of Patent: Nov. 26, 2019

(54) METHOD AND DEVICE FOR DATA TRANSMISSION AND COUNTER UNIT

(71) Applicant: GWF Messsysteme AG, Lucerne (CH)

(72) Inventor: Peter Mathis, Stansstad (CH)

(73) Assignee: GWF MESSSYSTEME AG, Lucerne (CH)

( * ) Notice: Subject to any disclaimer, the term of this patent is extended or adjusted under 35 U.S.C. 154(b) by 37 days.

(21) Appl. No.: 15/304,547

(22) PCT Filed: Jun. 16, 2016

(86) PCT No.: PCT/EP2016/063817
§ 371 (c)(1),
(2) Date: Oct. 17, 2016

(87) PCT Pub. No.: WO2016/202896
PCT Pub. Date: Dec. 22, 2016

(65) Prior Publication Data
US 2018/0102810 A1    Apr. 12, 2018

(30) Foreign Application Priority Data
Jun. 19, 2015  (EP) ................................... 15172905

(51) Int. Cl.
*H04B 3/54*   (2006.01)
*H03K 5/26*   (2006.01)
(Continued)

(52) U.S. Cl.
CPC .............. *H04B 3/548* (2013.01); *H03K 5/26* (2013.01); *H03K 21/02* (2013.01); *H03K 2005/00045* (2013.01); *H04B 2203/54* (2013.01)

(58) Field of Classification Search
CPC ...... H04B 3/548; H04B 2203/54; H03K 5/26; H03K 21/02; H03K 2005/00045; G06F 13/385; G06F 13/24; G06F 9/542
(Continued)

(56) References Cited

U.S. PATENT DOCUMENTS

2005/0025094 A1* 2/2005 Paneth ................. H04L 1/0003
                                                        370/328
2006/0023825 A1* 2/2006 Kato .................... G06F 13/4273
                                                        375/372
(Continued)

FOREIGN PATENT DOCUMENTS

CN    202475383 U    10/2012
DE    19922603 A1    11/2000

*Primary Examiner* — Brian W Wathen
*Assistant Examiner* — Alicia M. Choi
(74) *Attorney, Agent, or Firm* — William J. Clemens; Shumaker, Loop & Kendrick, LLP

(57) ABSTRACT

The method is used for transmitting signals and data within at least one first and one second transmission phase (TP1, TP2), which follow one another synchronously or asynchronously, between a first communication unit (L) and at least one second communication unit (Z), which comprises a central processor unit (CPU), a memory unit (M), in which an operating program (OP) is stored, and at least one first event generator (EG1), which monitors signal sequences (SL, SZ) transmitted via a transmission line (W) between the two communication units (L, Z) independently of the central processor unit (CPU) and generates event notifications (e1, e2) for events during the data transmission, which occur in accordance with the applied transmission protocol, which event notifications are transmitted to the central processor unit (CPU) and/or to at least one event user (EU1).

12 Claims, 6 Drawing Sheets

(51) Int. Cl.
*H03K 21/02* (2006.01)
*H03K 5/00* (2006.01)

(58) Field of Classification Search
USPC .......................................................... 700/286
See application file for complete search history.

(56) References Cited

U.S. PATENT DOCUMENTS

| | | | |
|---|---|---|---|
| 2007/0239318 A1* | 10/2007 | vanRuymbeke | G01F 15/063 |
| | | | 700/295 |
| 2008/0046706 A1* | 2/2008 | Hirai | G06F 11/2294 |
| | | | 713/1 |
| 2013/0121224 A1* | 5/2013 | Sugitani | H04J 3/1694 |
| | | | 370/311 |
| 2016/0266563 A1* | 9/2016 | Mizutani | G05B 19/05 |
| 2016/0370823 A1* | 12/2016 | Dobbs | G06F 1/12 |
| 2017/0139468 A1* | 5/2017 | Wilson | G06F 15/17362 |
| 2017/0237505 A1* | 8/2017 | Lucamarini | H04B 10/5161 |
| | | | 398/185 |
| 2017/0324245 A1* | 11/2017 | Kakuda | H02J 3/14 |

\* cited by examiner

METHOD AND DEVICE FOR DATA TRANSMISSION AND COUNTER UNIT

FIELD

The invention relates to a method for data transmission between a first and at least one second communication unit, particularly a method for unidirectional or bidirectional transmission of data between a reading unit and a counter unit, by means of which e.g. the consumption of a liquid or gaseous medium, such as gas or water, or the consumption of electrical or thermal energy can be measured.

BACKGROUND

DE19922603A1 e.g. discloses a method and a device for remote reading of a consumption meter or a counter unit, the counter data of which are detected and can be transmitted via a remote data transmission path to a remote reading module or to a reading unit.

The reading unit and the counter unit may be coupled to one another conductively via continuous lines or inductively. Inductive coupling makes it possible, if necessary, to couple a first coupling coil, which is connected to a mobile reading unit, to a stationarily installed second coupling coil, via which counter data can be read out from the counter unit. In the case of conductive coupling, counter data can be transmitted by means of a switched DC voltage signal without a carrier signal. In the case of inductive coupling, a carrier signal is transmitted, which is modulated by means of the counter data to be transmitted. The DC voltage signal or carrier signal output by the reading unit can furthermore be used for remotely supplying the counter unit, if the same does not have its own power supply.

In addition, one or more counter units can also be read by means of one reading unit via a correspondingly configured network. Different network topologies are used, such as star topology, ring topology or bus topology.

Various protocols can be used for transmitting data. The communication protocol can define a plurality of communication layers, which are e.g. structured according to the OSI model.

A transmission standard that is often used for counters is M-bus (short for Meter-bus), which is specified in the series of standards EN13757. Via the M-bus, it is not only possible for counter data to be read out from counters and transmitted to a reading unit, but it is also possible for control commands to be sent to various sensors and actuators within the communication system, in order e.g. to thus control the consumption flow within the supply system remotely.

The M-bus is a hierarchical system, which is controlled by a master, which is connected to one or more slaves via a transmission line. The master is used as a reading unit in this case, which can read data from the slaves, which may be present in the design of the above-described counter unit. The communication between the master and the slaves takes place serially via a transmission line. To transmit data and electrical energy from the master to the slaves, a DC voltage is applied by the master to the transmission line, which is switched between 36 V and 24 V as a function of the data to be transmitted. A logical "1" corresponds to the higher voltage of 36 V, whilst a logical "0" corresponds to the lower voltage of 24 V. The power consumption of the slave is modulated accordingly for data bits which are sent from the slaves to the master. A logical "1" corresponds to a power consumption of 1.5 mA and a logical "0" corresponds to an additional power consumption in the range from 11 to 20 mA. A slight reduction in the voltage results when transmitting a logical "0" because of the bus impedance.

A further transmission method is known, in which the master or the reading unit applies an AC voltage signal or a DC voltage signal to the transmission line, which is interrupted in fixed or variable time intervals, so that time windows result, within which the slave or the counter unit can transmit data to the reading unit.

The monitoring of the data transmission process, e.g. the determination of the time window within which data can be transmitted, takes place in the counter unit by means of a processor, usually by means of a signal processor. High-performance processors, particularly signal processors, are readily able in this case to monitor and control the data transmission process if they do not have to fulfil any other tasks. However, these processors are expensive and require much electrical power during the continuous monitoring of the data streams.

A correspondingly configured power supply must additionally be made available by the reading unit due to the high power losses of the processors.

SUMMARY

The present invention is therefore based on the object of overcoming the disadvantages of the prior art and providing an improved method and an improved device for data transmission between a first communication unit, e.g. a reading unit, and at least one second communication unit, e.g. a counter unit. Furthermore, an improved counter unit is to be created, from which counter data can be read by means of the method according to the invention.

It should be possible to equip the counter unit according to the invention using inexpensive processors, which can operate with relatively low clock frequencies and only have a low energy requirement and a low power loss.

Only a little processor power of the central processor unit provided in the counter unit should be used when applying the method according to the invention and the corresponding transmission of data and signals between the reading unit and the counter unit, so that a relatively large amount of processor power is available for further tasks, particularly metering tasks, or a less powerful processor can be used.

The method is used for transmitting signals and data within at least one first and one second transmission phase, which follow one another synchronously or asynchronously, between a first communication unit and at least one second communication unit, which comprises a central processor unit CPU (only CPU in the following), a memory unit, in which an operating program is stored, and at least one first event generator, which monitors signal sequences transmitted via a transmission line between the two communication units independently of the central processor unit and generates event notifications for events during the data transmission, which occur in accordance with the applied transmission protocol, which event notifications are transmitted to the central processor unit and/or to at least one event user.

Thus, the transmission of signals on the transmission line, carried out in accordance with the transmission protocol, can be monitored by means of the event generator, whilst the CPU processes further processes or rests. For example, the CPU can fulfil parallel tasks of the second communication unit, e.g. a counter function.

Any desired events, which can occur in accordance with the transmission protocol, can be detected by means of the at least one event generator. The transmission protocol may specify processes, which relate to the change of transmission phases and/or the transmission of data, as has been described at the beginning for the M-bus. For example, data can be transmitted in a frame structure. Furthermore, start sequences can be defined, by means of which the start of a data transmission is signalled. The occurrence of these events specified in the transmission protocol, such as the arrival of a header of a data frame, the arrival or the absence of a signal flank, the appearance of the address of the second communication unit or the arrival of data, can be detected by means of the event generator or the event generators. As a consequence, the required measures can be carried out by means of the output event notifications. A back transmission of data, in turn according to the transmission protocol, can take place in particular.

The appearance of the associated address of the second communication unit is preferably detected inside the first signal sequence by means of at least one of the event generators. The further method steps are preferably only carried out after the detection of the associated address, and event notifications for the further events are generated during the data transmission of the first signal sequence, which event notifications trigger the transmission of the second signal sequence from the addressed second communication unit to the first communication unit.

If the second communication unit is connected to the first communication unit within a network topology with at least one further second communication unit, the addressed second communication unit can therefore transmit stored data to the first communication unit in each case. If the second communication units have in each case been set to a sleep mode to some extent for the purpose of reducing energy consumption, these communication units can advantageously be reactivated by transmitting the corresponding address. In this manner, the second communication units can therefore be queried selectively in any desired network topology.

To detect the address, an event generator with a shift register can be used, into which a data sequence transmitted by the first communication unit is introduced. The appearance of this address can be detected by comparing the data in the shift register with the data of a register, into which the associated address is programmed.

Events, which are not specified in the transmission protocol, can additionally be monitored by means of the event generators. Error monitoring can advantageously take place. For example, the occurrence of overvoltages on the transmission line can be monitored and the first communication unit can be notified.

The event generator can be constructed e.g. as a filter, particularly as an envelope curve filter, or as an envelope curve detector, and as a result determine the envelope curve corresponding to the transmission phases or parts of this envelope curve of a first signal sequence transmitted from the first communication unit to the second communication unit.

On the basis of the determined envelope curve or parts thereof, it is possible e.g. to determine the first transmission phase, in which signals are transmitted from the first to the second communication unit, and the second transmission phase, in which signals and data can be transmitted from the second to the first communication unit.

Event users, which likewise provide services for the CPU and execute corresponding actions, can be used in the second communication unit for transmitting data from the second to the first communication unit and for further tasks.

Event generators and event users can likewise be used for data exchange between the event system and the CPU, which event generators and event users are constructed as I/O (input/output) units. If the event generator has generated an event notification, an event user, which is constructed as an I/O unit, can transmit this event notification to the CPU. Alternatively, an event generator, which is constructed as an I/O unit, can receive instructions from the CPU and supply the same as an event notification to an event user.

By means of an event notification, which is supplied to the CPU, e.g. an interrupt is triggered, which causes a main process executed by the CPU to be interrupted and a subroutine defined by the interrupt to be executed in the meantime. After the execution of the subroutine, the main process is continued after the last executed program lines.

Event generators and event users can therefore communicated with one another and also with the central processor unit CPU. This communication preferably takes place via an event manager, which is constructed as a router or multiplexer.

The event generators and event users therefore provide services for the CPU and relieve the CPU of the corresponding tasks.

The first communication unit is preferably constructed as a reading unit, which can read data from the second communication unit, which is preferably constructed as a counter unit, according to the method according to the invention. Although the method according to the invention can be used with any desired communication units which can fulfil different tasks, in the following, the first communication unit is termed a reading unit and the second communication unit is termed a counter unit, without a limitation taking place as a result.

As events during data transmission, which are relevant for the applied transmission protocol, often occur in large temporal intervals, only proportionately little processor time is used for completing processor tasks which are required for data transmission. The method according to the invention can be used with any desired transmission protocols, such as the M-bus protocol described at the beginning. It is important that the events based on the protocol can be detected during data transmission. That is to say, the event generators are to be designed and configured accordingly. For example, event generators are used in the configuration of filters or detectors, which can be realized advantageously by means of timer units.

Preferably, a processor module, e.g. the AVR10001 from Atmel, is used, which together with the CPU comprises an event system with event generators and event users, which can be used for the method according to the invention.

In preferable configurations, event generators and event users are used, which can preferably be programmed or configured individually by means of the operating program, so that they can fulfil the assigned task in every phase of the process of data transmission. For example, an event generator is provided, which monitors the transmission of signal sequences of a first frequency within the first transmission phase and the transmission of signal sequences of a second frequency within the second transmission phase, in order to determine the end of each transmission phase and/or to be able to detect data contained in the signal sequences. The event generator, e.g. a timer unit provided therein or a filter unit is therefore configured for each transmission phase in accordance with the frequencies that occur. If timer units are provided, the clock frequencies thereof are chosen e.g. proportionally to the frequencies of the signals which occur on the transmission line.

For example, a timer unit is provided, which is clocked by means of a clock signal and which can be reset by means of a corresponding edge of the signal sequence transmitted via the transmission line at corresponding times and at the output of which counter readings are formed which are compared with a threshold value in order to detect an event during data transmission, particularly the absence of the corresponding edge. If a square wave signal is transmitted from the reading unit to the counter unit, the timer unit is reset e.g. with each rising edge. If a rising edge no longer occurs, the timer unit continues to count up until the threshold value or a time out is reached. At this time, the state of the signal on the transmission line can be checked and it is possible to determine whether a change in state has taken place.

The first event user preferably comprises at least one second timer unit, which is clocked by means of a clock signal and by means of which a second signal sequence is generated, which is modulated in accordance with the data to be transmitted or is chosen and is subsequently transmitted to the reading unit for a certain period of time. This time period is preferably determined by means of a second event user on the basis of a third timer unit. That is to say, the third timer unit is started with the start of the transmission of the second signal sequence, which timer unit triggers an action or resets the second event user after a time cycle has expired. Alternatively, the time period can be monitored by the first event generator, which triggers an event notification as soon as the re-occurring first signal sequence, which signals a change of the transmission phase, and the second signal sequence overlap.

The change of the transmission phases is preferably predetermined by the reading unit, which is configured as a master. By contrast, the counter units act as slaves, which can transmit data to the reading unit within transmission phases, which are assigned to them by the reading unit. The counter units or slaves therefore monitor the signal sequence transmitted by the reading unit, by means of which the data and electrical energy can be transmitted to the counter units. The envelope of the first signal sequence is preferably formed, within which signal gaps or second transmission phases are determined, in which data with a second signal sequence can be transmitted to the reading unit. This second signal sequence, which is transmitted on the same transmission line as the first signal sequence and conveyed together with the same to the input of the counter unit, makes it more difficult to determine the envelope curve by contrast and is preferably filtered and suppressed in the counter unit for this purpose. This can in turn advantageously be completed using event generators and event users without using the working capacity of the processor.

DESCRIPTION OF THE DRAWINGS

The method according to the invention, the device for data transmission according to the invention and the reading unit according to the invention are described by way of example in the following in preferred embodiments. In the figures:

FIG. 3a shows the signal sequences SL, SZ of FIG. 2a, wherein the unmodulated second signal sequence SZ within the second transmission phase TP2 represents one data bit "1";

FIG. 3b shows a block diagram of the event generators EG1 and EG2 and the first event user of FIG. 2a with the signals occurring in the graph of FIG. 3a;

FIG. 4a shows the signal sequences SL, SZ of FIG. 2a, wherein the first signal sequence SL is a DC voltage signal, the potential of which is switched during the transitions between the transmission phases TP1, TP2;

FIG. 4b shows a block diagram of the event generators EG1 and EG2 and the first event user of FIG. 2a with the signals occurring in the graph of FIG. 4a;

DETAILED DESCRIPTION

Figure 1:
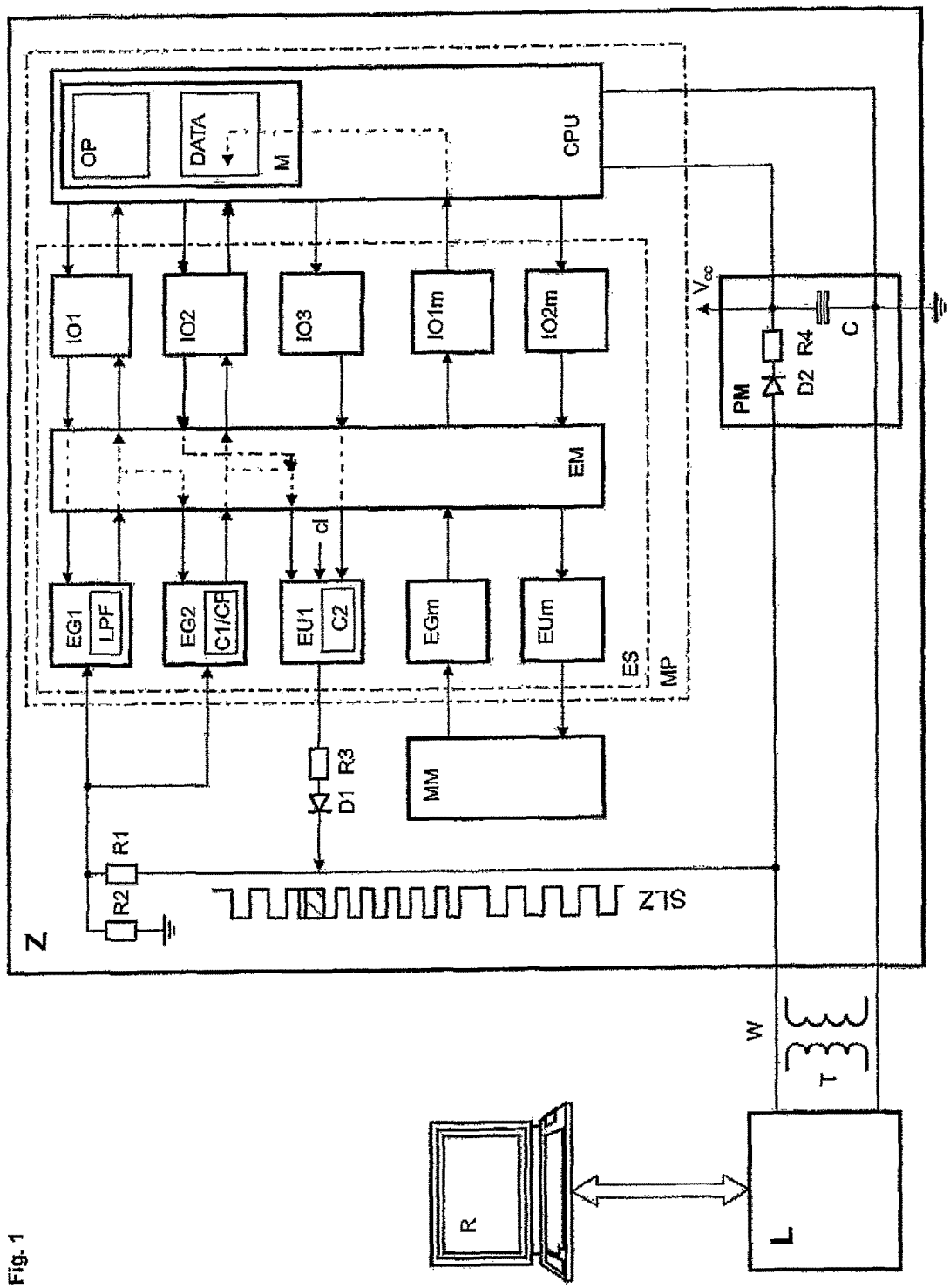
FIG. 1 shows a schematic block diagram of a device according to the invention for transmitting data within at least one first and one second transmission phase, which follow one another synchronously or asynchronously, having a reading unit L and a counter unit Z, which communicate via a transmission line W.

FIG. 1 shows a device for data transmission according to the invention, having a first communication unit L and a second communication unit Z, which are connected to one another via a transmission line W. The data transmission can take place bidirectionally or unidirectionally from one to the other communication unit L, Z or Z, L. Furthermore; a synchronous or asynchronous transmission of data can take place. Furthermore, a switched DC voltage can be transmitted, into which data signals are injected if necessary. Furthermore, an AC voltage can be transmitted, which is modulated in accordance with the data to be transmitted if necessary.

The transmission line W may have continuous lines, so that a DC voltage potential can be transmitted.

As FIG. 1 shows, the communication units L, Z can by contrast also be connected to one transmission line in each case, at the ends of which coupling coils are provided. The coupling coils can in this case form elements of a transformer T or can optionally be able to couple to one another inductively, so that the communication units L, Z can be coupled to one another as required, if data should be transmitted. In the present exemplary embodiment, the second communication unit Z is constructed as a counter unit, by means of which e.g. the consumption of a liquid or gaseous medium, such as gas or water, or the consumption of electrical or thermal energy can be recorded. To this end, the counter unit Z has a measuring module MM, which is e.g. connected to sensors and forms measurement data DATA, which are stored in a memory unit M of a microprocessor or microcontroller MP. These measurement data DATA can subsequently be read using the first communication unit L which is designed as a reading unit in this exemplary embodiment. To this end, a transmission protocol is used, in accordance with which the measurement data DATA are transmitted from the counter unit Z to the reading unit L. The collected measurement data DATA are transmitted from the reading unit L e.g. to a central computer R.

Additionally, the transmission protocol may also specify the transmission of data from the reading unit L to the counter unit Z. The transmission protocol may further provide that data may be exchanged within a network topology between at least one reading unit L and a plurality of counter units Z. It is also fundamentally possible that the communication units L, Z optionally apply one of a plurality of transmission protocols.

The communication units L, Z can furthermore be supplied autonomously by their own power supply unit or supplied with power via the transmission line W.

The present embodiment provides that the counter unit Z is supplied with power by the reading unit L by means of a DC voltage or by means of an AC voltage. To this end, a power supply module PM with a diode D2 is provided, which applies a positive DC voltage or positive half waves of an AC voltage via a resistor R4 to a charging capacitor C, which subsequently supplies the counter unit Z with power.

The counter unit Z comprises a central processor unit CPU, which is connected to the aforementioned memory unit M, in which an operating program OP and the measurement data DATA are stored. For communicating with the reading unit L, the CPU uses the services of an event system ES, which has one or more event generators EG1, EG2, EGm and preferably one or more event users EU1, EUm, which preferably communicate with one another via an event manager EM. In this preferable embodiment, input and output units IO1, IO2, IO3 are furthermore provided, which can likewise act as event generators and/or as event users.

The event generators generally monitor processes and generate event notifications for certain events, which occur within the processes. The event users trigger actions as soon as they are notified of an event. The event users can also be notified of events indirectly. For example, an event generator generates an events notification which is transmitted to the CPU, which subsequently sends an instruction corresponding to the event notification to an event user. The event notification itself generated by the event generator can also be notified to the CPU via an event to user, namely one of the I/O units IO1, IO2, IO3.

The event system ES therefore makes services available to the CPU and relieves the CPU of tasks when dealing with processes which can run continuously and would absorb considerable resources of the CPU.

The event system ES therefore interacts with the continuous data transmission process and determines relevant information or events, which are notified to the CPU or processed further in the event system ES directly.

The interesting processes in the processes monitored by the event system ES, in the process of data transmission in the current case, are therefore to be defined. Furthermore, the event generators are to be designed accordingly, so that the events can be detected.

Likewise, the event users are to be designed accordingly, so that they can trigger the corresponding actions, which are preferably likewise specified in the corresponding protocol for the data transmission.

Figure 2:
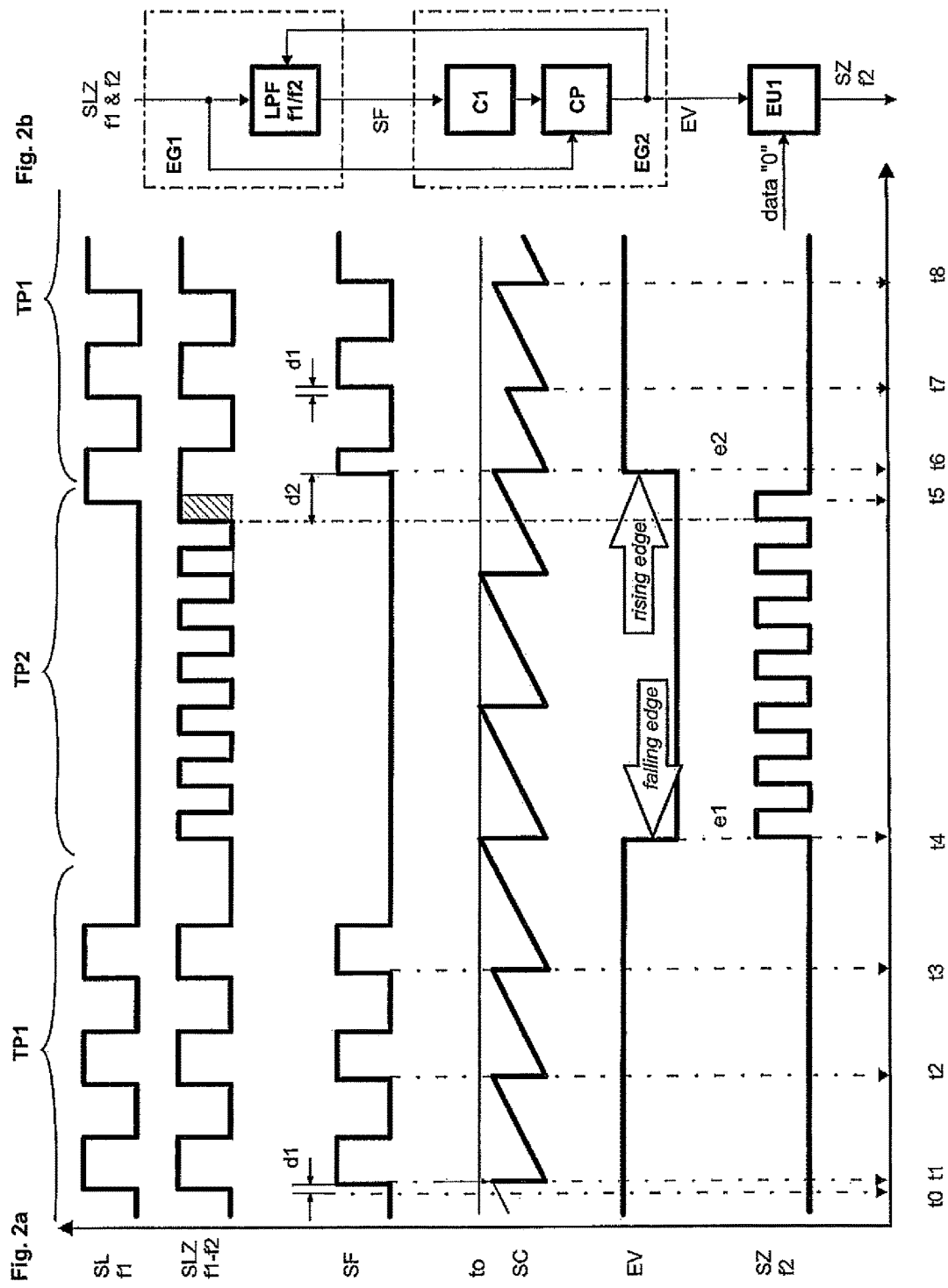
FIG. 2a shows a first signal sequence SL output by the reading unit L and a second signal sequence SZ output by the counter unit Z, which occur within the first and second transmission phases TP1, TP2 in the device or on the transmission line W of FIG. 1.
FIG. 2b shows a block diagram of the event generators EG1 and EG2, by means of which changes of the first signal sequence SL in the transitions between the transmission phases TP1, TP2 can be detected and a first event user EU1, by means of which the second signal sequence SZ can be generated.

In the present embodiment, a first event generator EG1 is constructed as a controllable low-pass filter LPF, which allows signals lying below a first or a second limit frequency to pass. The low-pass filter LPF is controlled as a function of the present transmission phase, i.e. the first transmission phase TP1, in which signals are transmitted from the reading unit L to the counter unit Z, or the at least one second transmission phase TP2, in which signals are transmitted from the counter unit Z to the reading unit L as shown in FIG. 2a.

Furthermore, a second event generator EG2 is provided, by means of which the transitions between the two transmission phases TP1, TP2 are determined. As the change of the transmission phases TP1, TP2 are predetermined by the reading unit L, the envelope curve of the first signal sequence SL (FIG. 2a), which is transmitted from the reading unit L to the counter unit Z, is preferably determined. To determine the envelope curve, a first timer unit C1 and a comparator CP are provided in the second event generator EG2, which are explained in more detail in the following.

The low-pass filter LPF provided in the first event generator EG1 and a first event user EU1 are controlled on the basis of the determined transitions of the transmission phases TP1, TP2 or the edges of the envelope curve of the first signal sequence SL. After the start of the second transmission phase TP2, a second signal sequence is applied by the first event user EU1, in which a second time unit C2 is preferably arranged, to the transmission line W via a resistor R3 and a diode D1 and transmitted to the reading unit L. It is illustrated in FIG. 2a that when the first transmission phase TP1 restarts, the first and the second signal sequence overlap, as a result of which the detection of the transition from the first to the second transmission phase TP1-TP2 is made more difficult. The second signal sequence SZ is therefore preferably filtered out for determining the envelope curve of the first signal sequence SL.

As mentioned, the event generator EG1 monitors the process of data transmission and releases the CPU or a corresponding signal processor from this task. FIG. 1 shows that to this end, the first signal sequence SL of the reading unit occurring on the transmission line W and inevitably also the second signal sequence SZ of the counter unit Z is conveyed to the input of the first event generator EG1 via a voltage divider R1/R2.

For an event that occurs, the event generator EG1 generates an event notification e1, e2 (FIG. 2a), which is conveyed via the event manager EM and the I/O unit IO1 preferably on the one hand to the CPU and on the other hand to an input of the first event user EU1.

The event notification is conveyed e.g. to an interrupt input of the CPU, so that the main process running in the CPU is interrupted and after a program jump, an interrupt routine or subroutine is executed, by means of which a trigger signal is triggered, which is supplied to the first event user EU1 via the I/O unit IO2. For example, previously stored measurement data DATA can be supplied to the event user EU1, whereupon the event user applies a corresponding output signal to the transmission line W via the resistor R3 and the diode D1.

The architecture of a microprocessor, particularly the principles of I/O hardware and software, particularly interrupt processes, are described in Andrew S. Tanenbaum, Modern Operating Systems, 2nd Edition, 2001 New Jersey, from page 269.

Before the exemplary description of processes for transmitting data between the reading unit L and the counter unit Z, it is pointed out that the services of the event system can also be used for further tasks. To this end, it is shown by way of example that the measuring module MM is likewise connected to the CPU via an event generator EGm and an event user EUm as well as corresponding I/O units IO1$m$, IO2$m$. A continuously running measuring process can be monitored by means of the event generator EGm, whilst it is possible to control this measuring process using the event user EUm.

The modules of the event system ES shown in FIG. 1 can be chosen and configured as desired. Filter stages, AD converters, DA converters, timer units, frequency generators, DMA (direct memory access) units, etc. can be used as required as event generators EG and/or as event users EU. The event system ES can be structured independently of the microprocessor MP in this case. However, a microprocessor MP is preferably chosen, which already comprises event modules or the entire event system ES, by means of which the method according to the invention can be carried out.

FIG. 2a shows that the transmission of data and signals between the reading unit L and the counter unit Z takes place in two separate transmission phases TP1, TP2, which run cyclically and synchronously or asynchronously. During the first transmission phases TP1, a first signal sequence SL with a frequency of e.g. f1=30 kHz is transmitted in each case from the reading unit L to the counter unit Z. During the second transmission phases TP2, a second signal sequence SZ is transmitted in each case from the counter unit Z to the reading unit L, which is modulated as a function of the data to be transmitted. No modulation of the second signal sequence SZ takes place for a data bit "1". By contrast, for transmitting a data bit "0", the second signal sequence is modulated using a square wave signal, which has e.g. a frequency of f2=42 kHz. Both signal sequences are applied to the transmission line W, on which a combined signal sequence SLZ therefore occurs, which is supplied to the first event generator EG1. It is shown that the first and second signal sequence SL and SZ overlap when the first transmission phases TP1 restart in each case.

Resistive, capacitive and inductive influences inside the connection between the reading unit L and the counter unit Z lead to changes in the first signal sequence SL. Furthermore, high-frequency interference signals can occur on the transmission line W. Interference of this type is suppressed during the first transmission phase TP1 by means of the low-pass filter LPF provided in the first event generator EG1. For example, signals with a pulse width of less than 2 μs are blocked. Only signals, particularly the first signal sequence, the pulse width of which are greater than 2 μs, are allowed to pass from the first event generator EG1 to the second event generator EG2. The signals are therefore forwarded within the first transmission phase TP1 with a delay of d1=2 μs.

The first signal sequence SL is evaluated for the processing of the combined signal SLZ in the counter unit Z, particularly for determining the transmission phases TP1, TP2 determined by the reading unit L, which run in accordance with the envelope curve EV of the first signal sequence SL. The second signal sequence SZ, which has a higher frequency f2, is filtered so that this evaluation can take place. The limit frequency of the low-pass filter LPF in the first event generator EG1 is lowered accordingly, so that the frequency f2 of the second signal sequence SZ lies outside the pass band of the low-pass filter LPF. It is provided that pulses with a width of less than 12 μs are blocked by the low-pass filter LPF. The pulses of the second signal sequence SZ have a pulse width of approximately 11 μs at the frequency f2=42 kHz and are therefore blocked. The first signal sequence SL is therefore forwarded in the second transmission phase TP2 with a delay of d2=12 μs.

To carry out the method, the times, at which the second transmission phase TP2 begins and the second signal sequence SZ can be transmitted and the low-pass filter LPF can be adjusted and also at which the second transmission phase TP2 ends and the transmission of the second signal sequence SZ has to be stopped and the low-pass filter LPF has to be reset, are to be determined by means of the second event generator EG2 inside the counter unit Z.

These times can advantageously be read off from the envelope curve EV of the first signal sequence. To determine the envelope curve EV of the first signal sequence SL, a first timer unit C1 is provided in the second event generator EG2, which is reset for each rising edge of the signal output by the first event generator EG1 and otherwise runs up cyclically during a period duration Tc1 up to a time-out to and is reset when the time-out is reached. The period duration Tc1 is in this case chosen to be larger than the period duration of the first signal sequence SL, so that the same can be reliably detected.

FIG. 2a shows the course of the time the signal SC, which is reset at the times t1, t2 and t3 in each case before the time-out is reached due to the occurrence of a rising edge of the first signal sequence SL. At the same time, the logical state "1" of the signal is accepted on the transmission line W. After the transmission of the first signal sequence SL was finished before the time t4, the time the signal SC runs up to the time-out to at time t4 and is reset as a result, wherein the current logical state "0" of the signal is accepted on the transmission line W. On the basis of this transition from logical "1" to "0", a falling edge of the envelope curve EV first signal sequence SL is detected (see the arrow "falling edge").

The timer signal SC then continues to run cyclically up to time-out to until another rising edge of the filtered signal SF appears at the input of the timer unit C1, which rising edge shows that another first transmission phase TP1 has begun and a further first signal sequence SL has been transmitted by the reading unit L. At the same time, the logical state of the signal is scanned and accepted on the transmission line W. The logical state "1" present at this time t6 shows that a rising edge of the envelope curve EV of the first signal sequence SL is taking place (see the arrow "rising edge").

These state changes "falling edge" and "rising edge" of the envelope curve EV of the first signal sequence SL are detected in the event system ES of FIG. 1 as events e1, e2 and used for controlling the first event generator EG1, particularly the low-pass filter LPF and for controlling the first event user EU1.

The event e1 (falling edge) causes the output of the second signal sequence SZ by the first event user EU1 and the switchover of the low-pass filter LPF to a lower limit frequency. FIG. 2a shows by way of example that a logical "0" is transmitted with the second signal sequence SZ, for which the second signal sequence is modulated with a square wave signal of frequency f2=42 kHz.

It is shown that at time t5 another rising edge of the first signal sequence SL appears, which adjoins a pulse of the second signal sequence, for which reason a pulse width of more than 12 μs results, which is forwarded by the low-pass filter LPF with a delay d2, for which reason another rising edge at the input of the timer unit C1 results, as a result of which the same is reset and the logical state "1" of the combined signal sequence SLZ is accepted on the transmission line W for the envelope curve EV.

The occurrence of a rising edge (arrow "rising edge") is recorded at time t6 on the basis of the change of the state of the envelope curve EV from logical "0" to "1", The transmission of the second signal sequence SZ is adjusted and the low-pass filter LPF is reset to the higher limit frequency, which makes it possible to eliminate interference but reliably detect edges of the first signal sequence SL.

At the times t7 and t8, the timer unit C1 is reset again when a rising edge of the first signal sequence occurs.

The signal SF at the output of the low-pass filter LPF shows that by changing the limit frequency at the start of the first transmission phase TP1, a signal delay d2=12 µs and subsequently a delay of d1=2 µs takes place.

FIG. 2b shows the event generators EG1 and EG2 of FIG. 1, by means of which changes of the first signal sequence SL can be detected in the transitions between the transmission phases TP1, TP2. The combined signal sequence SLZ is supplied to the input of the event generator EG1 and filtered therein in the low-pass filter LPF. The output signal SF of the first event generator EG1, which is free from the second signal sequence SZ, is supplied to the input of the second event generator EG2 or the first timer unit C1, which triggers the comparator CP, which is connected downstream. The comparator CP scans the state of the signal on the transmission line W and determines whether an edge of the envelope curve EV and thus a transition between the transmission phases TP1, TP2 has therefore occurred.

Figure 3:
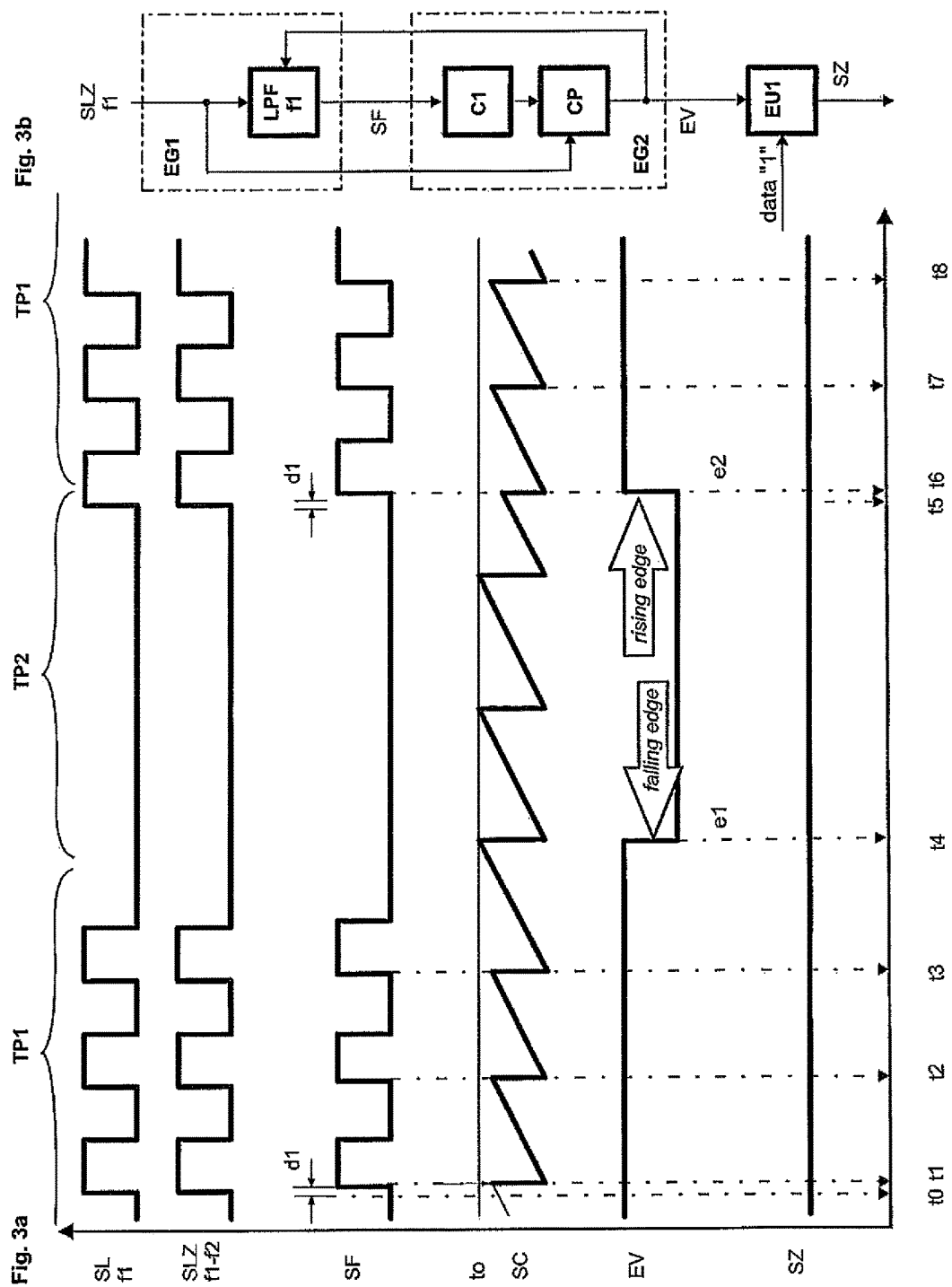

FIG. 3a shows the signal sequences SL, SZ and SLZ of FIG. 2a, wherein second signal sequence SZ represents a data bit "1" and is not modulated. The combined signal sequence SLZ is therefore identical to the first signal sequence SL, for which reason the limit frequency of the low-pass filter LPF does not have to be lowered. That is to say, the unmodulated second signal sequence SZ does not interfere with the detection of the envelope curve EV and does not have to be eliminated. As the low-pass filter LPF is not adjusted, the filtered signal SF is forwarded with the delay of d1=2 µs.

The rising edge of the first pulse of the first signal sequence SL occurring at time t5 is therefore merely forwarded with the delay d1=2 µs, whereupon the rising edge (see arrow: rising edge) of the envelope curve EV is detected at time t6.

With the falling edge of the envelope curve EV and the event notification e1 triggered as a result, the output of the unmodulated second signal sequence SZ is therefore triggered, without switching the low-pass filter LPF. With the rising edge of the envelope curve EV and the event notification e2, it is therefore likewise only the transmission of the second signal sequence SZ that is ended. The switchover of the low-pass filter LPF therefore preferably takes place taking account of the data to be transmitted.

FIG. 3b shows the event generators EG1 and EG2 of FIG. 2b, by means of which changes of the first signal sequence SL can be detected in the transitions between the transmission phases TP1, TP2. The signals SLZ, SF, EV, SZ that occur are entered in turn between the modules, which signals are shown in the graph of FIG. 3a.

Figure 4:
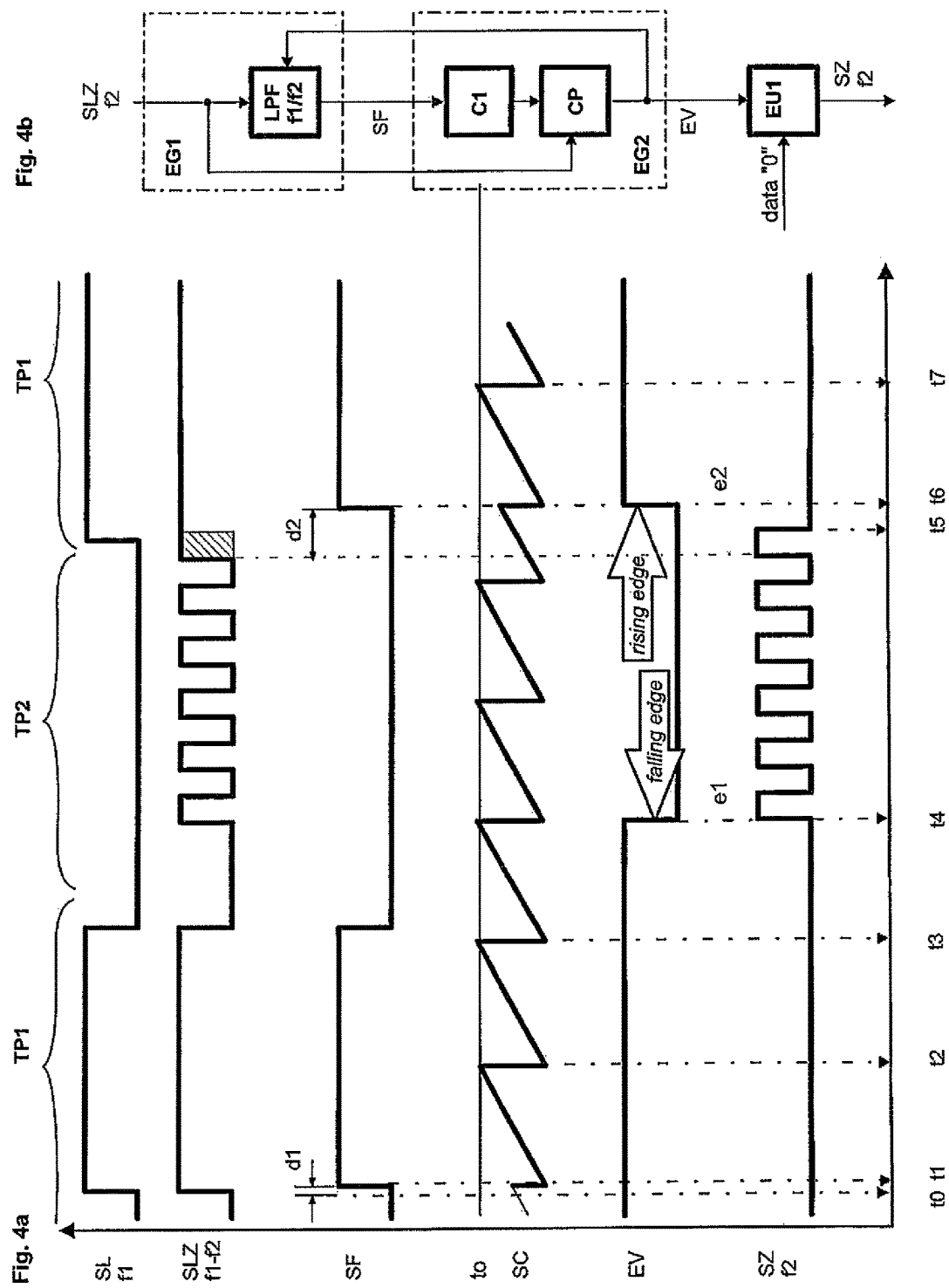

FIG. 4a shows the signal sequences SL, SZ and SLZ of FIG. 2a, wherein the first signal sequence SL is a DC voltage signal, the potential of which is switched during the transitions between the transmission phases TP1, TP2. At time t1, the timer signal SC is reset due to the occurrence of the rising edge of the first signal sequence SL at time t0 after a delay of 2 µs. Subsequently, up to time t6, no further rising edge of the first signal sequence SL occurs, for which reason the timer signal SC then runs up to the time-out to in each case, whereupon the timer signal SC is reset in each case and the current value of the first signal sequence SL is accepted. At time t4, the value logical "0" is accepted and the start of the second transmission phase TP2 is detected. With the corresponding event notification e1, the transmission of the second signal sequence SZ is started and the low-pass filter LPF is adjusted to the lower limit value, which ensures that the second signal sequence SZ does not appear in the output signal SF of the low-pass filter LPF. At time t5, the newly appearing first signal sequence SL and the second signal sequence SZ overlap, for which reason after the delay d2, a rising edge appears at the output of the low-pass filter LPF. As a result, the timer unit C1 is reset, a logical "1" is scanned on the transmission line W and, at time t6, a rising edge of the envelope curve EV is detected. After the detection of the new start of the first transmission phase TP1, the output of the second signal sequence SZ is ended and the limit frequency of the low-pass filter LPF is changed.

FIG. 4b shows the event generators EG1 and EG2 of FIG. 2b, by means of which changes of the first signal sequence SL can be detected in the transitions between the transmission phases TP1, TP2. It should be noted that only during the transmission of a logical "0" and the corresponding modulation of the second signal sequence SZ, is a switchover of the low-pass filter LPF to the lower limit frequency required.

Figure 5:
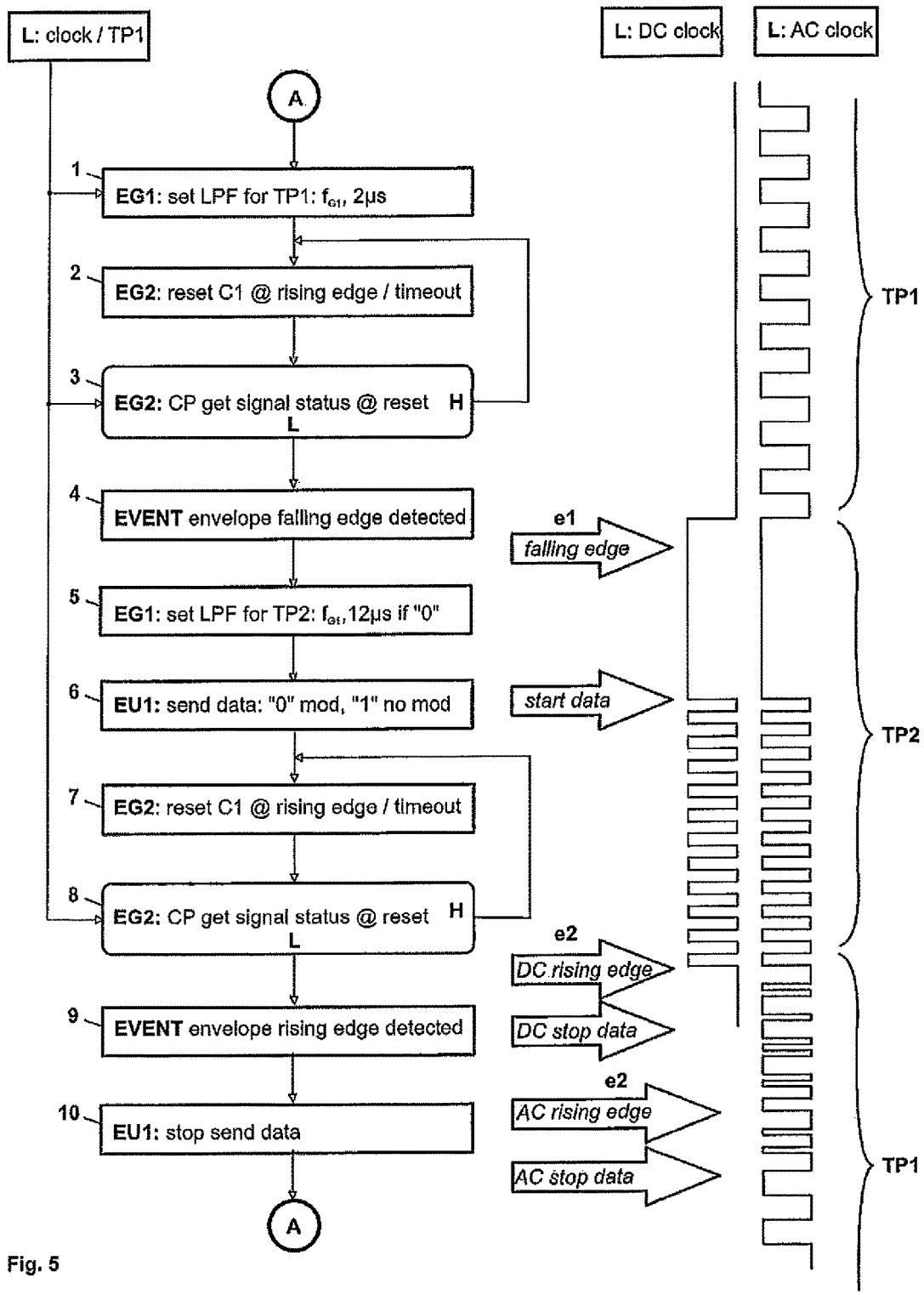
FIG. 5 shows a flow chart with the individual method steps which are carried out when carrying out the method for data transmission between the reading unit L and the counter unit Z of FIG. 1.

FIG. 5 shows a flow chart with the above-described method steps, which are completed in the device according to FIG. 1 during the change between the transmission phases TP1, TP2.

During the first transmission phases TP1, the first signal sequence SL is transmitted by their reading unit L either as a DC voltage signal (DC) or as an AC voltage signal (AC). During the second transmission phase TP2, a logical "0" is transmitted to the reading unit L by the counter unit Z with the output of the modulated second signal sequence SZ. In both cases AC and DC, a switchover of the low-pass filter LPF for the second transmission phase TP2 is therefore required to suppress the second signal sequence SZ, so that the envelope curve EV of the first signal sequence SL can be determined.

With method step 1, the limit frequency of the low-pass filter LPF is set in the first event generator EG1 to the higher value of e.g. 250 kHz, which makes it possible to suppress interference on the transmission line W.

With method step 2, the timer unit C1 is reset in the second event generator EG2 in each case when a rising edge occurs or when the time-out is reached.

With method step 3, the signal status on the transmission line W is scanned in the second event generator EG2 in the case of each reset of the timer unit C1, in order to detect a status change.

With method step 4, the event of the change of the transmission phase TP1-TP2 or the start of the second transmission phase TP2 is detected and a corresponding event notification e1 is transmitted.

With method step 5, the limit frequency of the low-pass filter LPF in the first event generator EG1 is set to a lower value of e.g. 35 kHz in accordance with the frequency of the second signal sequence SZ, which makes it possible to suppress the second signal sequence SZ with the frequency of 42 kHz, which would cause interference during the determination of the envelope curve EV. This adjustment preferably only takes place if the second signal sequence SZ is modulated for the transmission of a logical "0".

With method step 6, the first event user EU1 transmits the second signal sequence SZ.

With method step 7, the timer unit C1 is reset in the second event generator EG2 in each case when a rising edge occurs or when the time-out is reached.

With method step 8, the signal status on the transmission line W is scanned in the second event generator EG2 in the case of each reset of the timer unit C1, in order to detect a status change.

With method step 9, the event of the change of the transmission phase TP1-TP2 is detected and a corresponding event notification e2 is transmitted.

With method step 10, the transmission of the second signal sequence SZ is stopped in the first event user EU1. It is shown that the rising edge of the envelope curve EV is detected earlier if the first signal sequence SL is a DC voltage signal.

Figure 6:
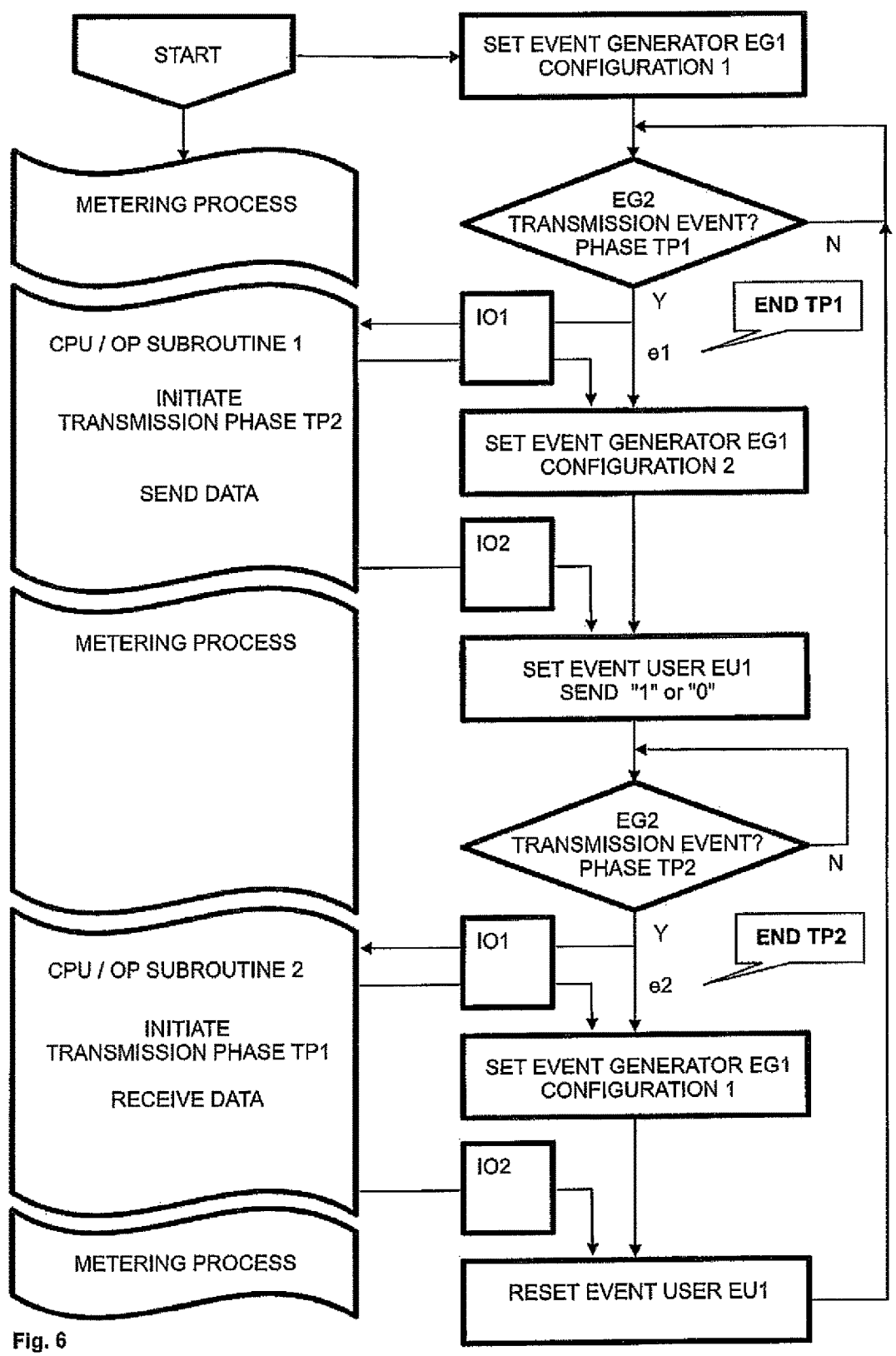
FIG. 6 shows a graph with an event-driven process sequence for data transmission on the right side and the sequence of a main process on the left side, which is interrupted in each case during a change of the transmission phases TP1, TP2 or TP2, TP1.

FIG. 6 shows a graph with an event-driven process sequence for data transmission on the right side and the sequence of a main process on the left side, which is interrupted in each case during a change of the transmission phases TP1, TP2 or TP2, TP1.

In this exemplary embodiment, the CPU is processing a measuring process or metering process, wherein a corresponding program is executed. This program sequence is selectively interrupted if event notifications e1, e2 arrive on the part of event-driven processing, by means of which notifications a jump to a subroutine 1 or 2 is triggered in each case. The event system ES is configured for the next transmission phase TP1 or TP2 in each case by means of the subroutines 1 or 2, if this is necessary. Furthermore, if necessary data are received or data, particularly measurement data or counter data, are sent.

During commissioning of the counter unit Z, the metering process and the data transmission process or the event system ES are initialized. To this end, the event generator EG1 is configured for monitoring the first signal sequence SL during the first transmission phase TP1. The first signal sequence SL is filtered by the first event generator EG1 and transmitted to the second event generator EG2, which detects a change of the transmission phase TP1/TP2 and generates an event notification e1.

After the detection of the event of the completion of the first transmission phase TP1, a first event notification e1 is transmitted via the first I/O unit IO1 to the CPU, which sends configuration data via the same I/O unit IO1 to the first event generator EG1, in order to configure the same for the second transmission phase TP2. The CPU furthermore sends data via the second I/O unit IO2 to the first event user EU1, which are transmitted to the reading unit L during the second transmission phase TP2.

In its second configuration, the event generator EG1 then in turn filters the combination SLZ of the first and second signal sequences SL and SZ occurring on the transmission line W and forwards the same to the second event generator EG2, which generates a second event notification e2 as soon as the completion of the second transmission phase TP2 is determined. The second event notification e2 is in turn transmitted to the CPU via the first I/O unit IO1, which sends configuration data to the first event generator EG1 via the same I/O unit IO1, in order to configure the same again for the first transmission phase TP1. The first event user EU1 is reset via the second I/O unit IO2 and the transmission of the second signal sequence SZ is ended.

It is therefore possible by means of the event system ES, to control the data transmission without substantially loading the microprocessor MP. However, more complex transmission processes can also be handled by means of the event system. For example, data transmitted by the reading unit L can be detected by means of event generators EG.

By means of appropriate configuration of the event modules of the event system ES, data can therefore be transmitted based on any desired transmission protocols bidirectionally or unidirectionally, synchronously or asynchronously, between the communication units L and Z.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A method for transmitting data signals within at least one first and one second transmission phase, which transmission phases follow one another synchronously or asynchronously, between a first communication unit and a second communication unit, comprising the steps of:

providing in the second communication unit a central processor unit, a memory unit connected to the central processor unit in which an operating program is stored, and a first event generator;

operating the first event generator to monitor signal sequences of the data signals transmitted via a transmission line between the first and second communication units independently of the central processor unit;

operating the first event generator to generate event notifications for events during the data signals transmission, which events occur in accordance with an applied transmission protocol;

operating the first event generator to transmit the event notifications to at least one of the central processor unit and a first event user in the second communication unit; and wherein during the first transmission phase, a first of the signal sequences is transmitted from the first communication unit to the second communication unit and during the second transmission phase, a second of the signal sequences is transmitted from the second communication unit to the first communication unit, the second signal sequence being generated in the second communication unit by the central processor unit or the first event user.

2. The method according to claim 1 wherein to determine a change of the transmission phases, the first signal sequence is monitored, edges of an envelope curve corresponding to the first signal sequence are determined and first and second of the event notifications are formed in correspondence to the edges.

3. The method according to claim 2 wherein the first event generator comprises a controllable filter that is configured for each of the transmission phases as required and which filters the signal sequences occurring on the transmission line during each of the transmission phases and forms a filtered signal that is free from interference and from the second signal sequence.

4. The method according to claim 3 wherein a second event generator is provided in the second communication unit, which monitors the signal sequences occurring on the transmission line or the filtered signal and determines signal edges, which signal edges represent a change of the transmission phases.

5. The method according to claim 4 wherein the second event generator comprises a first timer unit to which the filtered signal is supplied and which is reset in each case when a rising edge of the filtered signal occurs or when a time-out is reached, wherein for each reset of the timer unit, a state of the signal sequences on the transmission line or the filtered signal is scanned, a state change is determined and the first or second event notification corresponding thereto is formed.

6. The method according to claim 3 wherein the first event user is started by the first event notification and generates the second signal sequence until stopped by the second event notification, or a limit frequency of the low-pass filter in the first event generator is lowered after completion of the first transmission phase by the first event notification and is increased after completion of the second transmission phase by the second event notification, so that the limit frequency of the low-pass filter during the second transmission phase is lower than a frequency of the second signal sequence and the second signal sequence is blocked.

7. The method according to claim 1 including providing a second event user configured as an in-/output unit and transmitting the event notifications via an interrupt input to the central processor unit or providing a second event generator is configured as an in-/output unit and forwarding processor signals to the first event user or to another event user.

8. The method according to claim 1 including providing an event manager connected to the first event generator, the first event user and the central processor unit wherein the event notifications, actions of the first event user, and data and instructions transmitted from the central processor unit are exchanged among the first event generator, the first event user and the central processor unit through the event manager.

9. The method according to claim 1 wherein an occurrence of an associated address of the second communication unit is detected within the first of the signal sequences by the first event generator and responding to the detection of the associated address by generating the event notifications for the further events during the data transmission of the first signal sequence, the event notifications triggering transmission of the second of the signal sequences from the second communication unit to the first communication unit.

10. A device for transmitting data signals between a first communication unit and a second communication unit connected by a transmission line, the second communication unit comprising:
- a central processor unit connected to a memory unit in which an operating program is stored;
- at least one event generator operating independently of the central processor unit by which signal sequences of the data signals transmitted via the transmission line between the first and second communication units are monitored, the at least one event generator generating event notifications for events during the data signals transmission that are relevant for an applied transmission protocol, the event notifications being transmitted by the at least one event generator to at least one of the central processor unit and at least one event user in the second communication unit; and
- wherein the first communication unit is configured as a reading unit by which, during first transmission phases of the data signals, a DC voltage signal or an AC voltage signal is transmitted as a first of the signal sequences to the second communication unit which is configured as a counter unit by which, during second transmission phases of the data signals, counter data is transmitted in a second of the signal sequences to the reading unit.

11. The device according to claim 10 wherein the counter unit has a plurality of the at least one event generator and a plurality of the at least one event users for controlling data transmission with and communication with the central processor unit.

12. The device according to claim 11 wherein the event generators, the event users and the central processor unit are integrated in a microprocessor.

* * * * *